United States Patent
Nugent, Jr. et al.

(10) Patent No.: US 10,459,114 B2
(45) Date of Patent: Oct. 29, 2019

(54) WIRELESS POWER TRANSMITTER AND RECEIVER

(71) Applicant: LASERMOTIVE, INC., Kent, WA (US)

(72) Inventors: Thomas J. Nugent, Jr., Bellevue, WA (US); Jonathan Charles Kagle, Bellevue, WA (US)

(73) Assignee: LASERMOTIVE, INC., Kent, WA (US)

( * ) Notice: Subject to any disclaimer, the term of this patent is extended or adjusted under 35 U.S.C. 154(b) by 0 days.

(21) Appl. No.: 15/574,668

(22) PCT Filed: May 18, 2016

(86) PCT No.: PCT/US2016/033086
§ 371 (c)(1),
(2) Date: Nov. 16, 2017

(87) PCT Pub. No.: WO2016/187306
PCT Pub. Date: Nov. 24, 2016

(65) Prior Publication Data
US 2018/0138755 A1     May 17, 2018

Related U.S. Application Data

(60) Provisional application No. 62/163,307, filed on May 18, 2015.

(51) Int. Cl.
*H01M 10/44* (2006.01)
*H01M 10/46* (2006.01)
(Continued)

(52) U.S. Cl.
CPC ............... *G01V 8/22* (2013.01); *G01S 7/003* (2013.01); *G01S 7/006* (2013.01); *G01S 7/484* (2013.01);
(Continued)

(58) Field of Classification Search
CPC .......... H02J 7/355; H02J 7/0042; H02J 7/025; H02J 5/005; H02J 7/35; H02J 50/20; H02J 50/30; H02J 50/60
(Continued)

(56) References Cited

U.S. PATENT DOCUMENTS

| | | | |
|---|---|---|---|
| 5,771,114 A | 6/1998 | Andersson et al. | |
| 8,262,244 B2 * | 9/2012 | Metcalf | A47B 21/00 362/127 |

(Continued)

FOREIGN PATENT DOCUMENTS

| | | |
|---|---|---|
| EP | 1 469 617 A2 | 10/2004 |
| EP | 1 469 619 A2 | 10/2004 |
| WO | 2007/036937 A2 | 4/2007 |

OTHER PUBLICATIONS

International Search Report, dated Jul. 20, 2016, for International Application No. PCT/US2016/033156, 4 pages.
(Continued)

*Primary Examiner* — Edward Tso
(74) *Attorney, Agent, or Firm* — Seed IP Law Group LLP

(57) ABSTRACT

Embodiments are directed towards a multi-stage wireless power transmission system that includes a transmitting unit and a receiving unit. The transmitting unit transmits a power beam to the receiving unit, which converts the power beam into local electrical power and provides it to a personal electronic device without a corded connection between the receiving unit and a mains power supply. The transmitting unit includes a light-based transmitter to generate and transmit a power beam towards the receiving unit. The receiving unit includes a receiver to receive at least a portion of the power beam and to convert the received power beam into local electrical power. The receiving unit also includes a power output unit to provide the received local power to a personal electronic device when the personal electronic (Continued)

device, which is separable from the receiving unit, is electrically coupled to the power output unit.

19 Claims, 4 Drawing Sheets

(51) Int. Cl.
| | |
|---|---|
| G01V 8/22 | (2006.01) |
| G01S 17/02 | (2006.01) |
| G01S 17/87 | (2006.01) |
| G01S 17/88 | (2006.01) |
| G01S 7/00 | (2006.01) |
| G01S 7/484 | (2006.01) |
| H01S 5/00 | (2006.01) |
| H01S 5/062 | (2006.01) |
| H01S 5/42 | (2006.01) |
| H04B 10/80 | (2013.01) |
| H02J 50/60 | (2016.01) |
| H02J 50/30 | (2016.01) |
| H04B 10/114 | (2013.01) |
| H02J 50/10 | (2016.01) |
| G01S 17/89 | (2006.01) |
| H02J 50/90 | (2016.01) |
| G01S 17/06 | (2006.01) |

(52) U.S. Cl.
CPC ............ *G01S 17/026* (2013.01); *G01S 17/06* (2013.01); *G01S 17/87* (2013.01); *G01S 17/88* (2013.01); *G01S 17/89* (2013.01); *H01S 5/005* (2013.01); *H01S 5/0085* (2013.01); *H01S 5/06216* (2013.01); *H01S 5/423* (2013.01); *H02J 50/10* (2016.02); *H02J 50/30* (2016.02); *H02J 50/60* (2016.02); *H02J 50/90* (2016.02); *H04B 10/1141* (2013.01); *H04B 10/807* (2013.01)

(58) Field of Classification Search
USPC .......................... 320/101, 107, 108, 114, 115
See application file for complete search history.

(56) References Cited

U.S. PATENT DOCUMENTS

| | | | |
|---|---|---|---|
| 9,838,143 B2 | 12/2017 | Chan et al. | |
| 9,912,379 B2 | 3/2018 | Hyde et al. | |
| 2004/0266367 A1* | 12/2004 | Tuominen | H04B 10/807 455/91 |
| 2006/0266917 A1 | 11/2006 | Baldis et al. | |
| 2010/0079005 A1 | 4/2010 | Hyde et al. | |
| 2012/0153893 A1* | 6/2012 | Schatz | B60L 11/182 320/108 |
| 2014/0176061 A1* | 6/2014 | Cheatham, III | H02J 17/00 320/108 |
| 2015/0137732 A1* | 5/2015 | Lai | H02J 7/025 320/101 |

OTHER PUBLICATIONS

International Search Report, dated Nov. 4, 2016, for International Application No. PCT/US2016/033086, 5 pages.

* cited by examiner

WIRELESS POWER TRANSMITTER AND RECEIVER

CROSS-REFERENCE TO RELATED APPLICATION

This application claims the benefit under 35 U.S.C. § 119(e) of U.S. Provisional Patent Application No. 62/163,307, filed on May 18, 2015, entitled "Provisional Patents for Wireless Power" which is hereby incorporated by reference in its entirety.

BACKGROUND

Technical Field

The present disclosure generally relates to systems and methods to provide wireless power to personal electronic devices, and more particularly, but not exclusively to, utilizing an intermediate power storage system to receive wireless power from a transmitter, store the received power, and provide the stored power to a personal electronic device.

Description of the Related Art

Wireless delivery of power is of utility for many applications, including unmanned aerial vehicles and personal electronic devices, such as laptops and smartphones. Power beaming directs focused electromagnetic or acoustic power, which may be laser light, from a transmitter to a receiver in order to deliver power wirelessly. However, many personal electronic devices that consumers utilize today are not capable of receiving and converting a power beam into electricity for the personal electronic device. It is with respect to these and other considerations that the embodiments described herein have been made.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

Embodiments are directed towards a multi-stage wireless power transmission system. The system includes a transmitting unit and a receiving unit. The transmitting unit transmits a power beam to the receiving unit. The receiving unit converts the power beam into local electrical power and provides it to a personal electronic device without a corded connection between the receiving unit and a mains power supply.

The transmitting unit includes a transmitter to generate and transmit a power beam towards the receiving unit. The transmitting unit may also include a controller to manage the transmission of the power beam. For example, in some cases, the controller will adjust a timing or rate of the transmission of the power beam by the transmitter based on a number of interruptions of the power beam (caused by a safety system determining that an object is impinging the power beam) over a given time period. In other embodiments, the controller will direct transmission of the power beam according to one or more predetermined time slots, a particular scheduling algorithm, or according to some other mechanism. In some embodiments, the transmitting unit includes a locator device to determine a location of the receiver relative to the transmitter. The controller aims the transmitter at the receiver based on the determined location of the receiver.

The receiving unit includes a receiver to receive at least a portion of the power beam and to convert the received power beam into electrical power that is local to the receiving unit. The receiving unit also includes a power output unit to provide the received local power to a personal electronic device when the personal electronic device (that is separable from the receiving unit) is electrically coupled to the power output unit. In some embodiments, the power output unit includes a short-range-wireless-power-transfer device (e.g., an induction-based-power-transfer device) to provide the local power to the personal electronic device without a power cord. In other embodiments, the power output unit includes an electrical outlet to receive a power cord electrically coupled to the personal electronic device and to provide the local power to the personal electronic device.

In some embodiments, the receiving unit may also include a power storage system to store the local power when received by the receiver. The stored local power is later provided to the power output unit to be transferred to the personal electronic device. In other embodiments, the local power is provided to the personal electronic device via the power output unit without first being stored by a power storage system In a first embodiment, a system includes a transmitting unit and a non-stationary receiving unit. The transmitting unit includes a light-based transmitter to generate and transmit a power beam, and a controller to manage transmission of the power beam by the light-based transmitter. The non-stationary receiving unit, which is remote from the light-based transmitter, includes a light-based receiver to receive at least a portion of the power beam and to convert the received portion of the power beam into local electrical power, wherein the local electrical power is local to the non-stationary receiving unit. The non-stationary receiving unit also includes a power storage system to store the local electrical power and a power output unit to provide the local electrical power from the power storage system to a personal electronic device when the personal electronic device is electrically coupled to the power output unit. The personal electronic device is separable from the non-stationary receiving unit.

In some cases of the first embodiment, the power output unit of the non-stationary receiving unit includes a short-range-wireless-power-transfer device to wirelessly provide the local electrical power to the personal electronic device. In these cases, the short-range-wireless-power-transfer device is arranged to transfer the local electrical power via an inductive coupling to the personal electronic device. In other cases of the first embodiment, the power output unit includes at least one connector arranged to receive a power cord, and the power cord is electrically coupled to the personal electronic device and arranged to provide the local electrical power to the personal electronic device.

In some cases of the first embodiment, the non-stationary receiving unit is arranged to receive at least the portion of the power beam from the light-based transmitter in an absence of a corded electrical connection between the receiving unit and a mains power supply. In these cases, the non-stationary receiving unit is further arranged to provide the local electrical power to the personal electronic device in the absence of the corded electrical connection between the receiving unit and the mains power supply. In these and other cases of the first embodiment, the controller is arranged to direct the light-based transmitter to transmit the power beam toward a second non-stationary receiving unit.

The transmitting unit in some cases of the first embodiment includes a locator device to determine a location of the light-based receiver relative to the light-based transmitter. In these cases, the controller is arranged to aim the light-based transmitter at the light-based receiver based on the determined location of the receiver. The controller in some cases of the first embodiment is arranged to adjust a timing parameter associated with a transmission of the power beam by the light-based transmitter based on a number of interruptions of the power beam over a given time period.

In a second embodiment, a system includes a non-stationary receiving unit that is independent from a connection to a mains power supply and is remote from a light-based transmitter arranged to transmit a power beam to the receiving unit. The non-stationary receiving unit has a substantially planar table surface, a base to support the substantially planar table surface, and a light-based receiver integrated with at least one of the substantially planar table surface and the base. The light-based receiver is arranged to receive at least a portion of the power beam and further arranged to convert the received portion of the power beam into local electrical power that is local to the receiving unit. A power output unit is integrated with the substantially planar table surface to provide the local electrical power to an electronic device when the electronic device is electrically coupled to the power output unit.

In some cases a second embodiment, the power output unit of the non-stationary receiving unit includes a short-range-wireless-power-transfer device to wirelessly provide the local electrical power to the electronic device. In these and other cases of the second embodiment, the power output unit includes an electrical outlet to provide the local electrical power to the electronic device via a power cord.

In some cases of the second embodiment the non-stationary receiving unit is arranged to receive at least a portion of the power beam from the light-based transmitter in an absence of a corded electrical connection between the receiving unit and the mains power supply. Here, the non-stationary receiving unit is further arranged to provide the local electrical power to the electronic device in the absence of the corded electrical connection between the receiving unit and the mains power supply. In still other cases, the receiving unit includes a power storage system to store the local electrical power received by the light-based receiver, the power storage system is arranged to provide the local electrical power to the power output unit, and the power storage system is integrated with at least one of the substantially planar table surface and the base.

In a third embodiment, a method includes transmitting a power beam from a light-based transmitter toward a receiving unit, receiving at least a portion of the power beam at the receiving unit, converting the received portion of the power beam into local electrical power, and providing the local electrical power to a personal electronic device in an absence of a corded connection between the receiving unit and a mains power supply. In this third embodiment, providing the local electrical power to the personal electronic device may include providing the local electrical power through a short-range-wireless-power-transfer device that transfers the electrical power to the personal electronic device without a power cord. In other cases, however, providing the local electrical power to the personal electronic device may include providing the local electrical power through an electrical outlet to the personal electronic device via a power cord.

In some cases, the method of the third embodiment also includes scanning an area surrounding the light-based transmitter to identify the receiving unit, and in response to identifying the receiving unit, determining a location of the receiving unit relative to the light-based transmitter. Here, the method also includes aiming the light-based transmitter at the receiving unit based on the determined location of the receiving unit. In these or other cases of the third embodiment, the method includes storing the local electrical power in a power supply that is local to the receiving unit prior to providing the local electrical power to the personal electronic device via the power output unit.

In still other cases of the third embodiment, the method includes detecting one or more objects in a vicinity of the power beam, determining that the one or more objects pose a risk of impeding the transmission of the power beam from the light-based transmitter to the receiving unit, and, in response to the determination of risk, interrupting the transmission of the power beam at least until the one or more objects exit the vicinity of the power beam. Alternatively, in other cases of a third embodiment, the method includes detecting one or more objects in a vicinity of the power beam, determining that the one or more objects pose a risk of impeding the transmission of the power beam from the light-based transmitter to the receiver, and in response to the determination of risk, decreasing an intensity of the power beam at least until the one or more objects exit the vicinity of the power beam.

This Brief Summary has been provided to introduce certain concepts in a simplified form that are further described in detail below in the Detailed Description. Except where otherwise expressly stated, the Brief Summary does not identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings. In the drawings, like reference numerals refer to like parts throughout the various figures unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings.

For a better understanding of the present invention, reference will be made to the following Detailed Description, which is to be read in association with the accompanying drawings.

DETAILED DESCRIPTION

Figure 1:
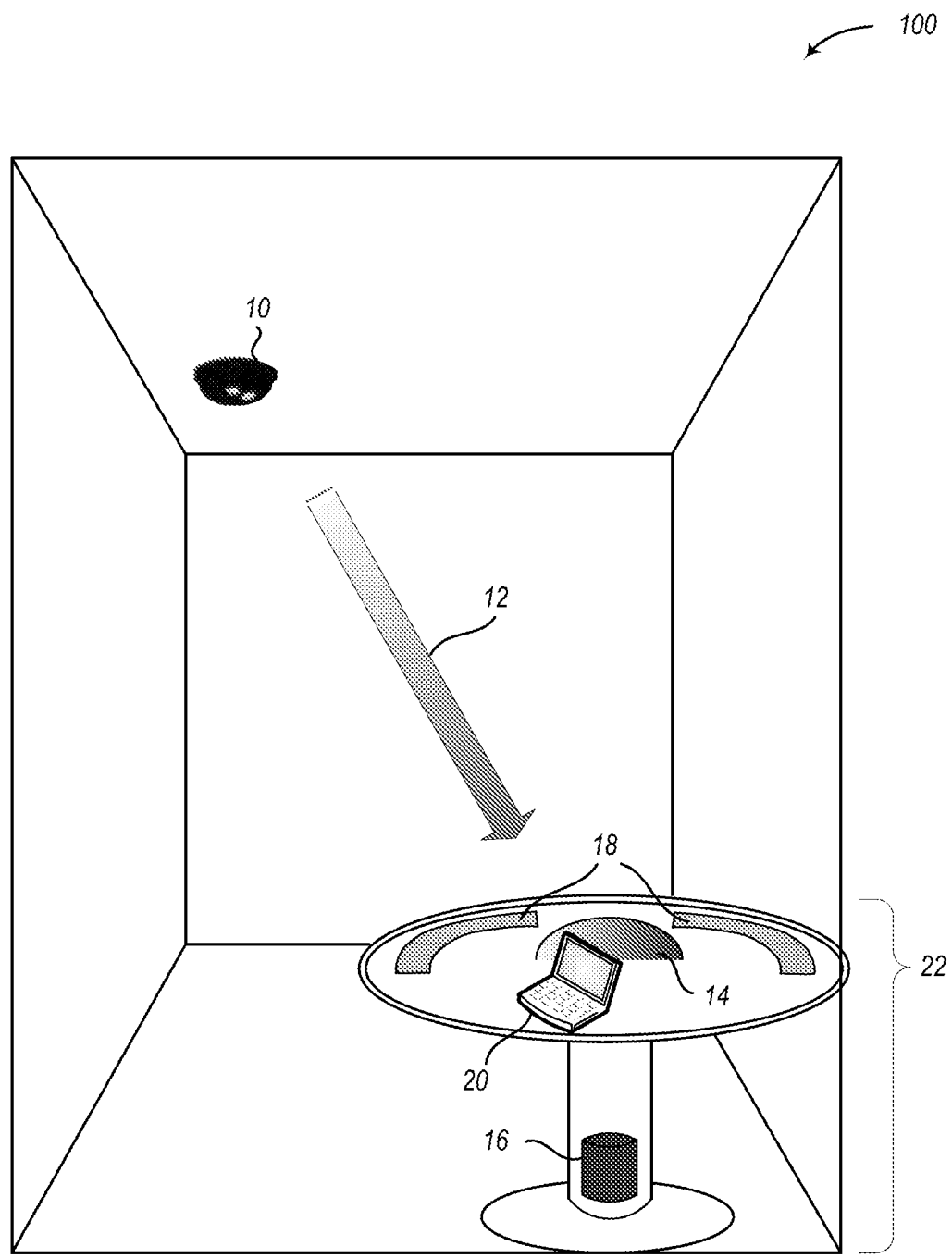
FIG. 1 is an illustrative example of an environment where a multi-stage wireless power system is utilized to provide wireless electrical power to a personal electronic device.

The present application is related to the following applications filed on the same day as the present application, naming the same inventors, and assigned to the same entity; each of said applications incorporated herein by reference to the fullest extent allowed by law: U.S. Pat. Appl. No. 15/574,655, entitled MULTI-LAYERED SAFETY SYSTEM, bearing client number 720173.405USPC; U.S. patent application Ser. No. 15/574,657, entitled LIGHT CURTAIN SAFETY SYSTEM, bearing client number 720173.406USPC; U.S. patent application Ser. No. 15/574,659, entitled DIFFUSION SAFETY SYSTEM, bearing client number 720173.407USPC; U.S. patent application Ser. No. 15/574,663, entitled POWER BEAMING VCSEL ARRANGEMENT, bearing client number 720173.408USPC; U.S. patent application Ser. No. 15/574,667, entitled LOCATING POWER RECEIVERS, bearing client number 720173.409USPC.

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to the communication systems and networks, have not been shown or described in order to avoid unnecessarily obscuring descriptions of the embodiments. Additionally, the various embodiments may be methods, systems, media, or devices. Accordingly, the various embodiments may be entirely hardware embodiments, entirely software embodiments, or embodiments combining software and hardware aspects.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

The term power beam is used, in all its grammatical forms, throughout the present disclosure and claims to refer to a high-flux light transmission that may include a field of light, that may be generally directional, that may be arranged for steering/aiming to a suitable receiver. The power beams discussed in the present disclosure include beams formed by high-flux laser diodes or other like sources including microwave sources, acoustic sources, and other electromagnetic sources sufficient to deliver a desirable level of power to a remote receiver without passing the power over a conventional electrical conduit, such as wire.

In the present disclosure, the term "light," when used as part of a light-based transmitter or a light-based receiver refers to a transmitter or receiver arranged to produce or capture, as the case may be, electromagnetic radiation that falls within the range defined by the electromagnetic spectrum spanning from extremely low frequencies (ELF) through gamma rays, which includes visible light, ultraviolet light, mid- and short-wavelength infrared light, and other visible and invisible light.

In various embodiments, the transmitter may also include or have an accompanying safety system to determine if an object is interfering with or about to interfere with the power beam. In various embodiments, one or more subsystems or mechanisms for detecting hazards, controlling the high-flux power beam activation, and otherwise providing safety features.

The terms "impinge," "impinge on," and the like, as used in the present disclosure, may be understood to include a physical impact, an obstruction in a line of sight path, an interference with, an encroachment of, and to have an effect upon. Accordingly, physical contact or direct obstruction is not required for one element to impinge on another. Instead, a first element may impinge on a second element if the first element is detected or determined to have an actual or imminent effect on the second element, even if the first element is only near the second element. A non-exhaustive list of words that may interchangeably be used in addition to, in place of, or to better understand any of the grammatical forms of the word "impinge" include, as the context directs: obstruct, encroach, touch, trespass, invade, impede, enter, impose, interfere, intrude, violate, accroach, and obtrude.

In many cases, the flux ($W/m^2$) in an optical high-flux power beam is substantially above the safe limit for exposure to living tissue such as a human or animal eye. In some cases, the flux is high enough to cause eye damage and/or other non-eye damage such as burns or other changes to living tissue. It is thus important to detect when people, animals, or other objects are in or will imminently enter the high-flux beam path during the time the beam is activated. In these and other cases, it may also be important to deter and/or prevent people, animals, and objects from entering the beam path while the beam is activated or will soon be activated.

In addition to direct exposure to a high-flux power beam, hazardous amounts of light may be reflected specularly or diffusely by objects in, or passing through, the power beam. In some cases the high-flux power beam may be intense enough to ignite flammable objects (e.g., paper, cardboard). Thus, unless the beam path is generally inaccessible to objects and living beings (e.g., in outer space), a laser power beaming system is improved by including a safety system arranged to detect hazards, including objects in or near the high-flux beam path, and to shut off the high-flux power beam or prevent the high-flux power beam from being activated.

The present invention may be understood more readily by reference to the following detailed description of the preferred embodiments of the invention. The terminology used herein is for the purpose of describing specific embodiments only and is not intended to be limiting. Unless specifically defined herein, the terminology used herein is to be given its traditional meaning as known in the relevant art.

FIG. 1 is an illustrative example of an environment 100 where a multi-stage wireless power system is utilized to provide wireless electrical power to personal electronic devices. The wireless electrical power may be provided to the personal electronic devices via an untethered power-transfer mechanism such as inductive coupling, magnetic resonance, short-range microwave, or some other technology.

As the use of personal electronic devices, especially tablets and smart phones, continues to increase, so too does the need for places to charge these devices. In many public places, users are often left looking for a wall outlet where they can plug in their personal electronic device. However, many public places do not have wall outlets that are accessible to the public. Some public places, such as airports and coffee shops, have started to install charging stations. These charging stations are typically in a corner or against a wall where there are outlets to plug the charging station into a mains power supply. The need for charging stations to be directly connected to the mains power supply forces the charging stations to be stationary or partially stationary with movement of a charging station being limited by the length of the power cord connecting the charging station to the mains power supply.

The power beam system described herein allows for charging stations, which will be referred to throughout as a multi-stage wireless power system or the receiving unit of the multi-stage wireless power, to operate without being connected to a mains power supply via a power cord. Accordingly, the multi-stage wireless power system described herein can be utilized in restaurants, coffee shops, airports, hotel lobbies, malls, or other locations where people may want to plug-in, charge, or recharge an electronic device while also having the freedom for the charging station to be independent of a power cord connected to the mains power supply. This independence for the charging station permits the proprietor, manager, administrator, or another person to secure or freely move the charging station at will to a location remote from a mains power supply.

As used herein, a "power cord" includes a multi-conductor wire or other electrically conductive conduit such as a line cord that supplies mains power, such as a 110 volt alternating current (AC), a 120 volt AC, a 220 volt AC, from a reasonably permanent power supply such as a power grid. A power cord may also include a low voltage cord such as a multi-conductor wire conduit that conforms to a Universal Serial Bus (USB) protocol. Other electrically conductive wires, cables, conductors, conduits, leads, and the like are also considered power cords in the present disclosure.

The multi-stage wireless power system includes a transmitting unit 10 and a receiving unit 22. The transmitting unit 10 includes a transmitter (not separately illustrated) that generates and transmits a power beam 12 to the receiving unit 22.

The receiving unit 22 includes a receiver 14, a power storage system 16, and a power output unit 18. The receiver 14 captures at least a portion of the power beam 12 and converts it into electrical power that is local to the receiving unit 22.

The power output unit 18 includes one or more electrical output devices that can transfer or otherwise provide the local power from the receiving unit 22 to a personal electronic device 20. In some embodiments, the power output unit 18 includes one or more short-range-wireless-power-transfer devices to transfer the local power to the personal electronic device 20 without a power cord electrically connecting the personal electronic device 20 to the receiving unit 22. The short-range-wireless-power-transfer devices can include induction-based devices (e.g., using magnetic induction, resonant induction, and other wireless power transfer technologies) or other electric coupling mechanisms that do not require the personal electronic device 20 to be plugged into the receiving unit 22 via a power cord. For example, the power output unit 18 can use charging "pads" that are embedded into a surface of an object. When a corresponding charging "pad" of the personal electronic device 20 comes into close proximity or physical contact with the charging pad on the object, the electrical power that is local to the receiving unit 22 is transferred to the personal electronic device 20.

In other embodiments, the power output unit 18 includes one or more electrical outlets that are arranged to accept a power cord of the personal electronic device 20, which can transfer the local power from the receiving unit 22 to the personal electronic device 20. Although FIG. 1 illustrates two short-range-wireless-power-transfer devices as the power output units 18, embodiments are not so limited and other numbers or combinations of wired or wireless power output units 18 may be utilized to transfer the local power from the receiving unit 22 to the personal electronic device 20.

In various embodiments, the local electrical power is stored in the power storage system 16. In various embodiments, the power storage system 16 is a rechargeable battery. Although FIG. 1 illustrates a single battery, embodiments are not so limited and other numbers of batteries or types of power storage systems may be utilized to store the local power. In some embodiments, the power storage system 16 may not be included, rather the local power may be provided from the receiver 14 to the power output unit 18 without being pre-stored. It should be understood that the transmitting unit 10 may include a safety system that interrupts the transmission of the power beam 12 if an object comes within the vicinity of the power beam 12. So without a power storage system 16, the power provided to the personal electronic device 20 may be intermittent if the power beam 12 is interrupted.

In FIG. 1, the receiving unit 22 is embodied in a non-stationary table having a substantially planar table surface and a base to support the substantially planar table surface. The table is non-stationary because it can be moved freely or secured to a wall, floor, or other fixture. Other terms that may be interchangeably used in the present disclosure in place of the term "non-stationary" include "non-fixed," "mobile," "movable," and the like.

During a charging phase, the table is within a line-of-sight of the transmitting unit 10. At other times, however, the table may be moved to a different location. For example, during daytime business hours, the table may be moved outdoors to a location that services the particular operations of a business, and during evening hours, the table may be moved indoors where its power storage system 16 is recharged. In addition, or in the alternative, some embodiments may de-activate a power beam during particular time windows, such as during an company's busiest hours.

In the embodiment of FIG. 1, the receiver 14 is a light-based receiver integrated with the table's surface. In other embodiments, however, the receiver 14 may be integrated in the table base or some other portion of the receiving unit 22. Generally speaking, the receiver 14 is arranged such that a line-of-sight transmission path between the receiver 14 and the transmitting unit 10 may be operatively arranged when convenient, necessary, or according to some particular schedule.

In some embodiments, the transmitting unit 10 includes circuitry or other electronic components (not illustrated) to determine a location of the receiving unit 22. As described herein, the receiving unit 22 is not connected to a mains power supply via a power cord and may be embedded in or be part of an object that is moveable. The location of the receiving unit 22 relative to the transmitting unit 10 may change if the object that includes the receiving unit 22 is moved. Accordingly, the transmitting unit 10 can determine where the receiving unit 22 (and in particular the receiver 14 of the receiving unit) is relative to the transmitting unit 10 and can aim the transmitter of the transmitting unit 10 at the receiving unit 22.

The personal electronic device 20 may be virtually any mobile or stationary electronic device that receives power or is charged or recharged from an external power supply. Examples of the personal electronic device 20 may include, but are not limited to, cell phones, smart phones, laptop computers, tablet computers, or other mobile electronic devices. The personal electronic device 20 may also include other electronic devices that are generally not considered mobile, such as, but not limited to, televisions, desktop computers, desk lamps, or other electronic devices. Although FIG. 1 illustrates only a single personal electronic device 20, embodiments are not so limited. In some embodiments, a plurality of personal electronic devices 20 may receive power from the receiving unit 22.

Figure 2:
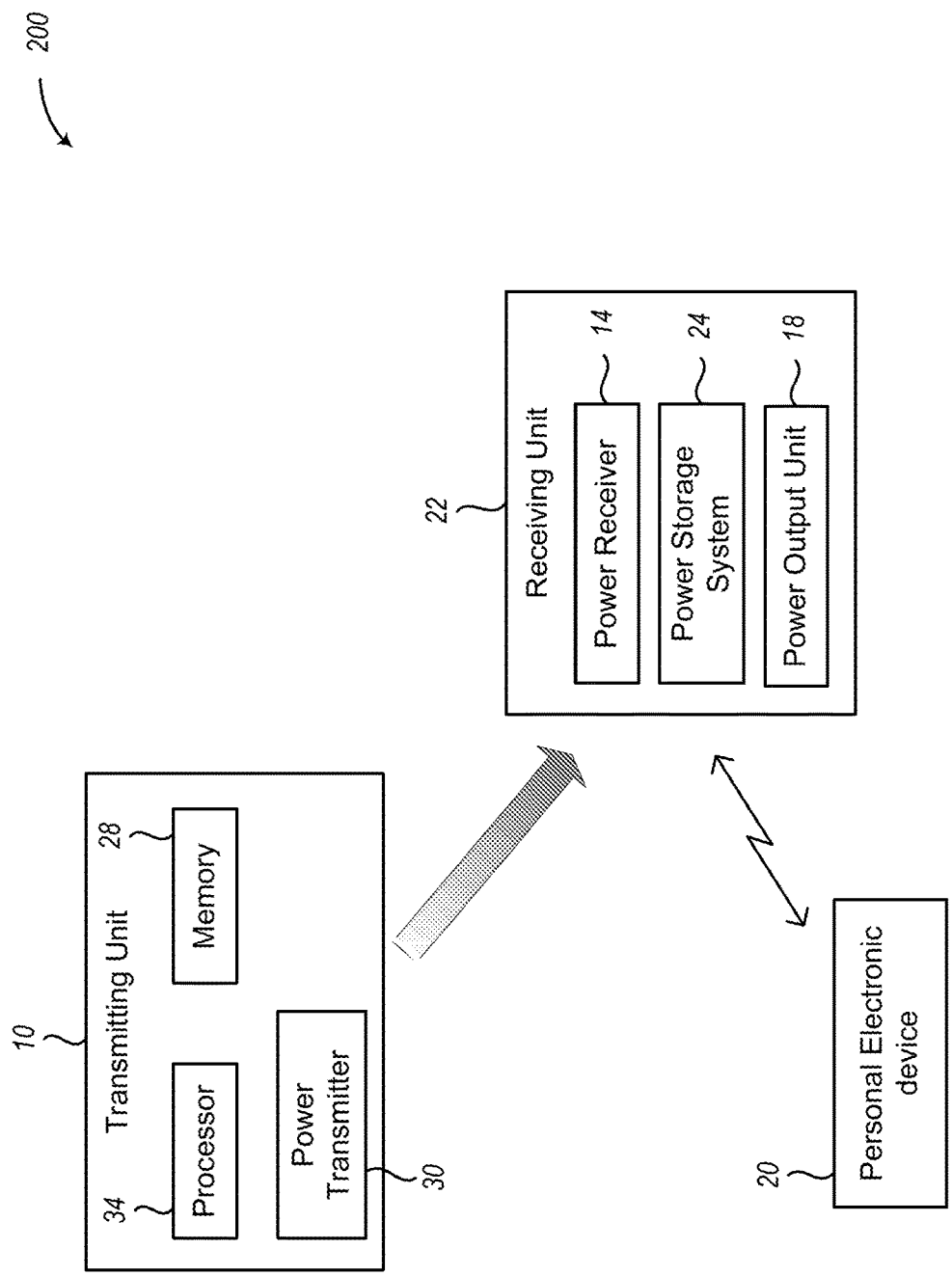
FIG. 2 is a system diagram of a multi-stage wireless power system.

FIG. 2 is a system diagram of a power beam system. As described above with respect to FIG. 1, the power beam system includes a transmitting unit 10 and a receiving unit 22. The transmitting unit 10 includes a processor 34, a memory 28, and a power transmitter 30. The power transmitter 30 generates and transmits the power beam to the receiving unit 22. Although FIG. 2 illustrates a single power transmitter 30, embodiments are not so limited. In some embodiments, the transmitting unit 10 may include a plurality of transmitters 30, with each transmitter 30 being dedicated for a separate receiving unit 22. In other embodiments, the transmitting unit 10 may include a single transmitter 30 arranged to power a plurality of receiving units 22. In still other cases, one or more transmitters 30 may be operated with one or more receiving units 22 in any useful arrangement.

The memory 28 stores computer-readable instructions that are executed by the processor 34. In some embodiments, the memory 28 may also store the location of one or more receiving units 22 after the location is determined by the transmitting unit 10. As described elsewhere herein, the power beam may be continuously transmitted to the receiving unit 22 (except for when it is interrupted due to an object), transmitted at predetermined times, transmitted at predetermined intervals, or transmitted on-demand when requested by the receiving unit 22. Accordingly, the memory 28 may store the timing and rate schedule for transmitting the power beam to each corresponding receiving unit 22.

The receiving unit 22 includes a power receiver 14, a power storage system 24, and a power output unit 18. The power receiver 14 includes at least one receiver to receive at least a portion of the power beam from the power transmitter 30 and convert it into electrical power that is local to the receiving unit 22. In some embodiments, there may be multiple power beams transmitting to the receiver 14 or there may be multiple receivers 14 arranged to receive power beams provided from multiple transmitters 30.

The power storage system 24 includes a battery or other electrical storage technology that can be charged by the electrical power received by the power receiver 14 and supply that stored power to the power output unit 18. As described elsewhere herein, the power output unit 18 includes one or more electrical output devices that can transfer or otherwise provide the local power from the receiving unit 22 to a personal electronic device 20.

In some embodiments, the receiving unit 22 may also include a processor, memory, or other circuitry (not illustrated) to perform other actions. For example, in some embodiments, the receiving unit 22 may monitor a charge or capacity level of the power storage system 24. When the capacity level falls below or otherwise crosses a predetermined threshold, then the receiving unit 22 transmits a signal to the transmitting unit 10 requesting or otherwise instructing the transmitting unit 10 to initialize transmission of the power beam to the receiver 14. Once the capacity level is crosses another threshold value, then the receiving unit 22 transmits another signal to the transmitting unit 10 instructing the transmitting unit 10 to halt the transmission of the power beam. In some embodiments, the transmitting unit 10 may wait idle unit it receives an instruction from the receiving unit 22 or it may transmit the power beam to another receiving unit 22.

Although FIG. 2 illustrates a single receiving unit 22, embodiments are not so limited. In some embodiments, a plurality of receiving units 22 may be charged by one or more transmitting units 10. In some embodiments, the transmitting unit 10 may transmit the power beam to one receiving unit 22 before transmitting the power beam to a different receiving unit 22. In at least one embodiment, the transmitting unit may systematically transmit the power beam to each of a plurality of receiving units 22 in a predetermined order for a predetermined amount of time or until the power storage system 24 of the corresponding receiving unit 22 is sufficiently charged. In other embodiments, the transmitting unit 10 may transmit the power beam to a receiving unit 22 that is being utilized by a highest number of personal electronic devices 20 or the receiving unit 22 that is outputting the most power to the personal electronic device 20.

Non-limiting and exemplary operation of certain aspects of the disclosure will now be described with respect to FIGS. 3 and 4. In at least one of various embodiments, processes 300 and 400 described in conjunction with FIGS. 3 and 4, respectively, may be implemented by or executed on one or more computing devices, such as transmitting unit 10, receiving unit 22, or other power beam systems.

Figure 3:
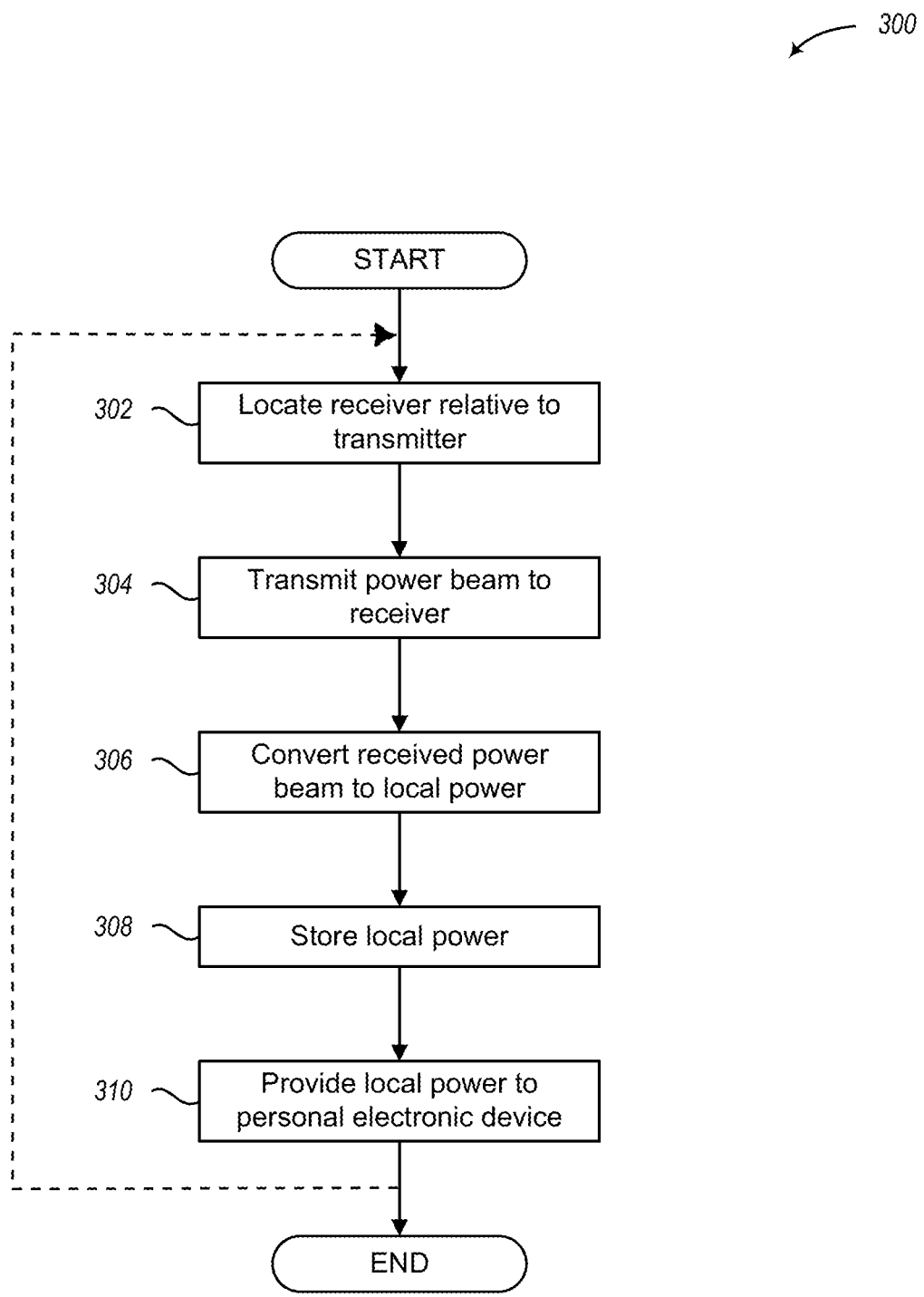
FIG. 3 is a logical flow diagram generally showing one embodiment of a process for utilizing a multi-stage wireless power system to provide wireless power to a personal electronic device.

FIG. 3 is a logical flow diagram generally showing one embodiment of a process for utilizing a multi-stage wireless power system to provide wireless power to a personal electronic device.

Process 300 begins after a start block. At block 302, a receiver(s) 14 of a receiving unit(s) 22 is identified and located by a transmitting unit 10. In various embodiments, the transmitting unit 10 includes a proximity detector that is arranged to locate the receiver 14 of a receiving unit 22. Various different types of location detection technology known to those skilled in the art can be utilizes, including, but not limited to, cameras, radio frequency triangulation, or other devices that can be used to locate another object (i.e., a receiver). Once the location of the receiver 14 is determined, the transmitter 30 is aimed towards the receiver 14 so that the power beam is transmitted towards the receiver 14.

As described herein, the receiving unit 22 may be stationary or non-stationary. Accordingly, the location of the receiving unit 22 (i.e., the receiver 14) may be monitored to determine if the receiving unit 22 has moved in a way that would require an adjustment to the aim of the power beam. This monitoring may occur periodically (e.g., once a minute) or it may be based on a sensor output (e.g., a rangefinder outputs a different distance between the transmitter 30 and the receiver 14). In yet other embodiments, the location of the receiver 14 may be provided by an administrator (e.g., by entering the coordinates of the receiver 14 relative to the transmitter 30) or the transmitter 30 may be manually aimed by the administrator.

Process 300 proceeds to block 304, where a power beam is generated and transmitted from the transmitter 30 to the receiver 14. As mentioned above, the power beam includes beams formed by high-flux laser diodes or other like sources sufficient to deliver a desirable level of power to the receiver 14 without passing the power over a conventional electrical conduit, such as wire.

In various embodiments, there may be more than one receiving unit 22 associated with a single transmitting unit 10. Accordingly, the transmitter 30 in the transmitting unit 10 may alternate transmitting the power beam between each receiving unit 22 as described elsewhere herein. In other embodiments, the transmitting unit 10 may include a separate transmitter 30 for each separate receiver 14 or receiving unit 22.

Process 300 continues at block 306, where the received flux from received power beam is converted into electrical power. Various techniques known to those skilled in the art may be employed to capture and convert the power beam into electrical power. In various embodiments, this electrical power is referred to as local electrical power because it is utilized by a receiving unit to provide power to a personal electronic device without being supplemented by other electrical power provided by a mains power supply via a power cord.

Process 300 proceeds next to block 308, where the local power is stored in a power storage system 24. In various embodiments, the local power is stored in a battery. In some embodiments, block 308 may be optional and may not be performed, rather the local power may be provided directly to a personal electronic device 20 without first being stored.

Process 300 continues next at block 310, where the local power is provided to an electronic device (e.g., personal electronic device 20) via a power output unit 18. As described elsewhere herein, receiving unit 22 includes a power output unit 18 that may include a short-range-wireless-power transfer device or an electrical outlet, or both. When a personal electronic device 20 is electrically coupled to the power output unit 18, such as via a charging "pad" for wireless power transfer or a power cord, the local power is transferred to the personal electronic device 20.

After block 310, process 300 optionally terminates. In other cases, processing may controllably, conditionally, or automatically return back to block 302.

Figure 4:
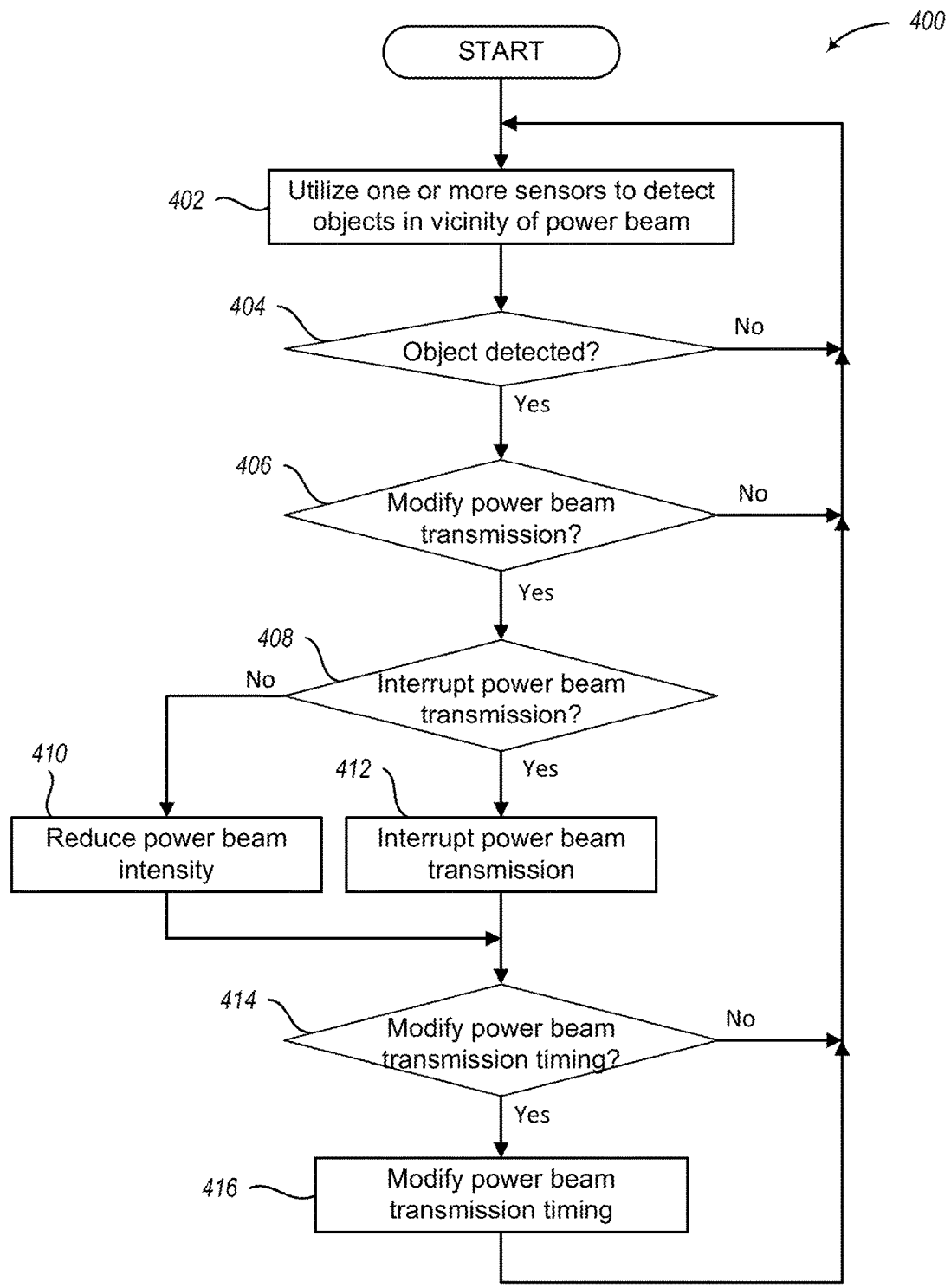
FIG. 4 is a logical flow diagram generally showing one embodiment of a process for modifying a power beam transmission to provide wireless power to a personal electronic device.

FIG. 4 is a logical flow diagram generally showing one embodiment of a process for modifying a power beam transmission to provide wireless power to a personal electronic device.

Process 400 begins after a start block. At block 402, one or more sensors are utilized to detect objects that are in the vicinity of the power beam. In various embodiments, objects in the vicinity of the power beam may include objects that are near, impeding, or about to impede the power beam. The one or more sensors can include, but are not limited to, light curtains, cameras, rangefinders, infrared sensors, radar sensors, ultrasound sensors, or other object detecting sensors.

Process 400 proceeds to decision block 404, where a determination is made whether one or more objects are detected in the vicinity of the power beam. In various embodiments, the sensors may provide object-intrusion information about a detected object. Such object-intrusion information may include, but is not limited to, a "binary" signal that indicates that a sensor has detected an object or other information about the detected object, such as a size of the object; location of the object relative to the power beam; distance from the transmitter or sensor; speed and direction the object is moving; or other information that is used to determine if the object is in fact impeding, near, or about to impede the power beam.

If an object is detected, process 400 flows to decision block 406; otherwise, process 400 loops to block 402 to continue to utilize and monitor the sensors for objects that are in the vicinity of the power beam. If the power beam transmission was previously modified at blocks 410 or 412 and there is no longer an object in the vicinity of the power beam, then the power beam transmission may return to normal operation.

At decision block 406 a determination is made whether to modify the power beam transmission. In some embodiments, the system may determine that the detected object will not impede the power beam, such as if the object becomes stationary or is moving in a direction away from the power beam. In this case, the power beam transmission may not be modified or otherwise altered. If the power beam transmission is altered, then process 400 flows to decision block 408; otherwise, process 400 loops to block 402 to continue to utilize and monitor the sensors for objects that are in the vicinity of the power beam.

At decision block 408, a determination is made whether to interrupt the power beam transmission. In some embodiments, this determination may be based on the type of object, whether it is in fact impeding the power beam, or whether the power beam will cause harm to the object. If the power beam transmission is to be interrupted, process 400 flows to block 412; otherwise, process 400 flows to block 410.

At block 412, the power beam transmission is interrupted. In some embodiments, interrupting the power beam transmission may include powering down or halting the power beam, closing a shutter or cap on the transmitter 30 to prohibit the power beam from being projected towards the receiver 14, or otherwise terminating the transmission of the power beam from the transmitter 30.

In various embodiments, a second transmitter may be instructed to begin transmitting a second power beam at the receiver 14. The second transmitter may be positioned in a different location than the first transmitter so that the second power beam arrives at the receiver from a different angle from the first power beam. In this way, if one power beam becomes interrupted, a second power beam, from a different location, can provide wireless power to the receiving unit.

After block 412, process 400 flows to decision block 414.

If, at decision block 408, the power beam transmission is not interrupted, then process 400 flows from decision block 408 to block 410. At block 410, the power beam intensity is reduced. In some embodiments, reducing the power beam intensity includes putting the power beam into a safe mode of operation. Although less power may be delivered to the receiver, the reduced power may still be sufficient to power the personal electronic device 20, to slowly recharge the power storage system 24 (e.g., if the personal electronic device 20 is not being charged by the receiving unit 22), or to slow the depletion or discharge of the power storage system (e.g., by supplementing the power provided by the power storage system power when charging the personal electronic device 20).

After block 410 and after block 412, process 400 flows to decision block 414, where a determination is made whether the power beam transmission timing is modified. The power beam may be continuously transmitted to the receiver (except for when it is interrupted due to an object), transmitted at predetermined times, transmitted at predetermined intervals, or transmitted on-demand when requested by the receiving unit. However, the rate, timing, or scheduling at which the power beam is transmitted to the receiving unit may be modified based on a variety of different factors, including, but not limited to, the number of interruptions over a given period of time, number of electronic devices drawing power from the receiving unit, a capacity level of the power storage system, the power storage system settings or design parameters, or other factors that may impact how often the power beam should be transmitted to the receiving unit. If the power beam transmission timing is to be modified, process 400 flows to block 416; otherwise, process 400 loops to block 402 to continue to utilize and monitor the sensors for objects that are in the vicinity of the power beam At block 416, the power beam transmission timing is modified. As mentioned above, the multi-stage wireless power system described herein may be utilized in a variety of different settings, such as restaurants, coffee shops, airports, hotel lobbies, malls, or other locations where people may want to plug-in, charge, or recharge an electronic device. If the power beam is to be continuously transmitted during business hours, it is possible that the power beam may be repeatedly interrupted due to high traffic volumes of people walking around the system. In this type of situation the power beam may be scheduled to be transmitted at predetermined times, such as during non-business hours or low-traffic hours. In some embodiments, low-traffic hours may be determined based on the number of power beam interruptions per hour or set by an administrator.

In some situations, only transmitting the power beam at low-traffic hours may not provide sufficient power to the receiving unit for the time when the power beam is not being transmitted. This situation may arise when the power storage system does not have a large enough volume to supply power to electronic devices for prolonged periods of time or to supply power to numerous electronic devices at the same time. Similarly, the power storage system may be designed for continuous charging or for steady interval charging. So in some embodiments, the power beam may be scheduled to be transmitted at predetermined time intervals for a predetermined amount of time. For example, the power beam may be transmitted to the receiving unit every hour for 10 minutes. In various embodiments, this scheduling may be adjusted or otherwise modified based on the number of interrupts of the power beam, properties of the power storage system, or other factors.

After block 416, process 400 returns to block 402 to continue to utilize and monitor the sensors for objects that are in the vicinity of the power beam.

Certain words and phrases used in the present disclosure are set forth as follows. The terms "include" and "comprise," as well as derivatives thereof, mean inclusion without limitation. Unless the context requires otherwise, throughout the specification and claims which follow, the word "comprise" and variations thereof, such as, "comprises" and "comprising" are to be construed in an open, inclusive sense, e.g., "including, but not limited to." The term "or," is inclusive, meaning and/or. The phrases "associated with" and "associated therewith," as well as derivatives thereof in all grammatical forms, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation, such a device may be implemented in hardware, firmware, or software, or some combination of at least two of the same. The functionality associated with any particular controller may be centralized or distributed, whether locally or remotely. Other definitions of certain words and phrases may be provided within this patent document. Those of ordinary skill in the art will understand that in many, if not most instances, such definitions apply to prior as well as future uses of such defined words and phrases.

Where one or more figures included in the present disclosure illustrates a data flow diagram, the illustrated process is a non-limiting process that may be used by embodiments of high-flux power beam or field systems. In this regard, each described process may represent a module, segment, or portion of software code, which comprises one or more executable instructions for implementing the specified logical function(s). It should also be noted that in some implementations, the functions noted in the process may occur in a different order, may include additional functions, may occur concurrently, and/or may be omitted.

The figures in the present disclosure illustrate portions of one or more non-limiting computing device embodiments. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

A processor (i.e., a processing unit), as used in the present disclosure, refers to one or more processing units individually, shared, or in a group, having one or more processing cores (e.g., execution units), including central processing units (CPU's), microcontrollers (MCU), digital signal processors (DSP), application specific integrated circuits (ASIC), and the like. The processors interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, embodiments describe software executable by the processor and operable to execute certain ones of the method acts.

As known by one skilled in the art, a computing device has one or more memories, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a floppy diskette, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

When so arranged as described herein, each computing device may be transformed from a generic and unspecific computing device to a combination device comprising hardware and software configured for a specific and particular purpose.

Database structures, if any are present in the power beam system embodiment or in other embodiments, may be formed in a single database or multiple databases. In some cases hardware or software storage repositories are shared amongst various functions of the particular system or systems to which they are associated. A database may be formed as part of a local system or local area network. Alternatively, or in addition, a database may be formed remotely, such as within a "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

In some cases, the memory is a non-transitory computer readable medium (CRM). The CRM is configured to store computing instructions executable by a processor of the power beam system. The computing instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the power beam system.

Buttons, keypads, computer mice, memory cards, serial ports, bio-sensor readers, touch screens, and the like may individually or in cooperation be useful to an operator of the power beam system. The devices may, for example, input control information into the system. Displays, printers, memory cards, LED indicators, temperature sensors, audio devices (e.g., speakers, piezo device, etc.), vibrators, and the like are all useful to present output information to the operator of the power beam system. In some cases, the input and output devices are directly or electronically coupled to a processor or other operative circuitry. In other cases, the input and output devices pass information via one or more communication ports (e.g., RS-232, RS-485, infrared, USB, etc.)

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

As used in the present disclosure, the term "module" refers to an application specific integrated circuit (ASIC), an electronic circuit, a processor and a memory operative to execute one or more software or firmware programs, combinational logic circuitry, or other suitable components (i.e., hardware, software, or hardware and software) that provide the functionality described with respect to the module.

The terms, "real-time" or "real time," as used interchangeably herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds, milliseconds, seconds, minutes or some other time frame as the context of the term's use implies), and that the activity may be performed on an ongoing basis (e.g., stopping the transmission of a high-flux power beam or field). An example of an activity that is not real-time is one that occurs over an extended period of time (e.g., hours, days, weeks, months, years, or some other time frame as the context of the term's use implies) or that occurs based on intervention or direction by a person or other activity.

The headings and Abstract of the Disclosure provided herein are for convenience only and do not limit or interpret the scope or meaning of the embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A system, comprising:
a transmitting unit and a non-stationary receiving unit, wherein the transmitting unit includes:

a light-based transmitter to generate and transmit a power beam; and
a controller to manage transmission of the power beam by the light-based transmitter, wherein managing said transmission includes:
detecting one or more objects in a vicinity of the power beam;
determining that the one or more objects pose a risk of impeding the transmission of the power beam from the light-based transmitter to the non-stationary receiving unit; and
in response to the determination of risk, decreasing an intensity of the power beam; and
wherein the non-stationary receiving unit is remote from the light-based transmitter, and wherein the non-stationary receiving unit includes:
a light-based receiver to receive at least a portion of the power beam and to convert the received portion of the power beam into local electrical power, wherein the local electrical power is local to the non-stationary receiving unit;
a power storage system to store the local electrical power; and
a power output unit to provide the local electrical power from the power storage system to a personal electronic device when the personal electronic device is electrically coupled to the power output unit, wherein the personal electronic device is separable from the non-stationary receiving unit.

2. A system according to claim 1, wherein the power output unit of the non-stationary receiving unit includes a short-range-wireless-power-transfer device to wirelessly provide the local electrical power to the personal electronic device.

3. A system according to claim 2, wherein the short-range-wireless-power-transfer device is arranged to transfer the local electrical power via an inductive coupling to the personal electronic device.

4. A system according to claim 1, wherein the power output unit includes at least one connector arranged to receive a power cord, the power cord electrically coupled to the personal electronic device and arranged to provide the local electrical power to the personal electronic device.

5. A system according to claim 1, wherein the non-stationary receiving unit is arranged to receive at least the portion of the power beam from the light-based transmitter in an absence of a corded electrical connection between the receiving unit and a mains power supply, and wherein the non-stationary receiving unit is further arranged to provide the local electrical power to the personal electronic device in the absence of the corded electrical connection between the receiving unit and the mains power supply.

6. A system according to claim 1, wherein the controller is arranged to direct the light-based transmitter to transmit the power beam toward a second non-stationary receiving unit.

7. A system according to claim 1, wherein the transmitting unit includes a locator device to determine a location of the light-based receiver relative to the light-based transmitter, and wherein the controller is arranged to aim the light-based transmitter at the light-based receiver based on the determined location of the receiver.

8. A system according to claim 1, wherein the controller is arranged to adjust a timing parameter associated with a transmission of the power beam by the light-based transmitter based on a number of interruptions of the power beam over a given time period.

9. A system, comprising:
a light-based transmitter arranged to transmit a power beam, wherein the light-based transmitter is arranged to:
detect one or more objects in a vicinity of the power beam;
determine that the one or more objects pose a risk of impeding the transmission of the power beam from the light-based transmitter to at least one device arranged to receive a portion of the power beam; and
in response to a determination that the one or more objects pose the risk of impeding the transmission of the power beam, decreasing an intensity of the power beam; and
a non-stationary receiving unit that is independent from a connection to a mains power supply and is arranged to receive the portion of the power beam from the light-based transmitter, the non-stationary receiving unit including:
a substantially planar table surface;
a base to support the substantially planar table surface;
a light-based receiver integrated with at least one of the substantially planar table surface and the base, the light-based receiver arranged to receive at least a portion of the power beam and to convert the received portion of the power beam into local electrical power that is local to the receiving unit; and
a power output unit integrated with the substantially planar table surface to provide the local electrical power to an electronic device when the electronic device is electrically coupled to the power output unit.

10. A system according to claim 9, wherein the power output unit of the non-stationary receiving unit includes a short-range-wireless-power-transfer device to wirelessly provide the local electrical power to the electronic device.

11. A system according to claim 9, wherein the power output unit includes an electrical outlet to provide the local electrical power to the electronic device via a power cord.

12. A system according to claim 9, wherein the non-stationary receiving unit is arranged to receive at least a portion of the power beam from the light-based transmitter in an absence of a corded electrical connection between the receiving unit and the mains power supply, and wherein the non-stationary receiving unit is further arranged to provide the local electrical power to the electronic device in the absence of the corded electrical connection between the receiving unit and the mains power supply.

13. A system according to claim 9, wherein the receiving unit includes a power storage system to store the local electrical power received by the light-based receiver, the power storage system arranged to provide the local electrical power to the power output unit, and the power storage system integrated with at least one of the substantially planar table surface and the base.

14. A method, comprising:
transmitting a power beam from a light-based transmitter toward a receiving unit;
receiving at least a portion of the power beam at the receiving unit;
converting the received portion of the power beam into local electrical power;
providing the local electrical power to a personal electronic device in an absence of a corded connection between the receiving unit and a mains power supply;
detecting one or more objects in a vicinity of the power beam;

determining that the one or more objects pose a risk of impeding the transmission of the power beam from the light-based transmitter to the receiver and in response to the determination of risk, decreasing an intensity of the power beam at least until the one or more objects exit the vicinity of the power beam.

15. A method according to claim 14, wherein providing the local electrical power to the personal electronic device includes providing the local electrical power through a short-range-wireless-power-transfer device that transfers the electrical power to the personal electronic device without a power cord.

16. A method according to claim 14, wherein providing the local electrical power to the personal electronic device includes providing the local electrical power through an electrical outlet to the personal electronic device via a power cord.

17. A method according to claim 14, further comprising:
scanning an area surrounding the light-based transmitter to identify the receiving unit;

in response to identifying the receiving unit, determining a location of the receiving unit relative to the light-based transmitter; and aiming the light-based transmitter at the receiving unit based on the determined location of the receiving unit.

18. A method according to claim 14, further comprising:
storing the local electrical power in a power supply that is local to the receiving unit prior to providing the local electrical power to the personal electronic device via the power output unit.

19. A method according to claim 14, further comprising:
detecting one or more objects in a vicinity of the power beam;

determining that the one or more objects pose a risk of impeding the transmission of the power beam from the light-based transmitter to the receiving unit; and in response to the determination of risk, interrupting the transmission of the power beam at least until the one or more objects exit the vicinity of the power beam.

* * * * *